United States Patent
Yamaguchi et al.

(10) Patent No.: US 6,747,351 B2
(45) Date of Patent: Jun. 8, 2004

(54) SEMICONDUCTOR DEVICE AND METHOD OF MANUFACTURING OF THE SAME

(75) Inventors: Shinji Yamaguchi, Tenri (JP); Takuro Asazu, Nara (JP); Atsushi Ono, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/971,268

(22) Filed: Oct. 5, 2001

(65) Prior Publication Data
US 2002/0081843 A1 Jun. 27, 2002

(30) Foreign Application Priority Data
Dec. 22, 2000 (JP) .................................. 2000-391548

(51) Int. Cl.⁷ .............................................. H01L 23/48
(52) U.S. Cl. ...................... 257/737; 257/750; 257/753; 257/766; 257/773; 257/780
(58) Field of Search ................... 257/678, 684, 257/690, 700, 735; 438/106, 107, 118

(56) References Cited

U.S. PATENT DOCUMENTS

| | | | | |
|---|---|---|---|---|
| 4,949,224 A | * | 8/1990 | Yamamura et al. | ......... 361/751 |
| 4,970,571 A | | 11/1990 | Yamakawa et al. | |
| 6,028,011 A | * | 2/2000 | Takase et al. | ............... 438/745 |
| 6,107,120 A | * | 8/2000 | Ohtsuka et al. | ............. 438/106 |

FOREIGN PATENT DOCUMENTS

| | | | | |
|---|---|---|---|---|
| JP | 04007839 | * | 1/1992 | ........... H01L/21/92 |
| JP | 10-256258 | | 9/1998 | |
| JP | 10-125682 A | * | 10/1998 | ......... H01L/21/321 |

* cited by examiner

Primary Examiner—Erik J. Kielin
Assistant Examiner—David L. Hogans
(74) Attorney, Agent, or Firm—Nixon & Vanderhye P.C.

(57) ABSTRACT

A defect-free film is formed on a surface of a protrusive electrode. An immersion Au film is formed on the surface of the protrusive electrode, after a gap which an immersion Au plating liquid can enter evenly is formed between a protrusive electrode made of Ni or a Ni alloy on an electrode pad made of Al or mainly made of Al and a protective coat by etching.

14 Claims, 4 Drawing Sheets

SEMICONDUCTOR DEVICE AND METHOD OF MANUFACTURING OF THE SAME

FIELD OF THE INVENTION

The present invention relates to a semiconductor device having a protrusive electrode and manufacturing method of the same, and more particularly it relates to a semiconductor device with a protrusive electrode to connect the device and other devices electrically, and manufacturing method thereof.

BACKGROUND OF THE INVENTION

Today, for an electrode pad made of Al (aluminum) or mainly made of Al (will be referred to as electrode pad) on semiconductor substrates, electroless plating is used as one of the methods to form a protrusive electrode that electrically connects the electrode pad and other devices.

The electroless plating can omit steps such as:
 a sputtering step that is required to form a barrier metal layer and an electrode in a step of plating;
 a photo step that is needed for a pattern formation of a protrusive electrode; and
 an etching step that eliminates a resist that is used in the step of pattern formation and a barrier metal that is used in the plating step.

Comparing with an electrolytic plating, the electroless plating can form the electrode pad with fewer steps. So the electroless plating has attracted attention as a method that enables to reduce costs as well as shorten delivery times.

The electroless plating is a method to selectively form a protrusive electrode made of Ni (nickel) or a Ni alloy (will be referred to as protrusive electrode) on the electrode pad. In this process, if an oxide film exists on the surface of the electrode pad, it deeply influences the form and reliability of the protrusive electrode, since the protrusive electrode cannot be formed uniformly on the electrode pad.

Therefore, before doing the electroless plating, the oxide film on the surface of the electrode pad is removed by sodium hydroxide, phosphoric acid, etc., to form a protrusive electrode in good and desired shape. However, a microscopic gap is formed between the protrusive electrode and the protective coat, because the protrusive electrode is developed from the surface of the electrode pad and not chemically joined with the protective coat on the semiconductor substrate.

Referring to FIGS. 5(a) through 5(d), the following description will discuss one example of methods to form a protrusive electrode on a electrode pad by the electroless plating.

FIGS. 5(a) through 5(d) are sectional process drawings of a method to form a protrusive electrode on the electrode pad made of Al or mainly made of Al through a commonly used electroless plating.

Figure 5A:
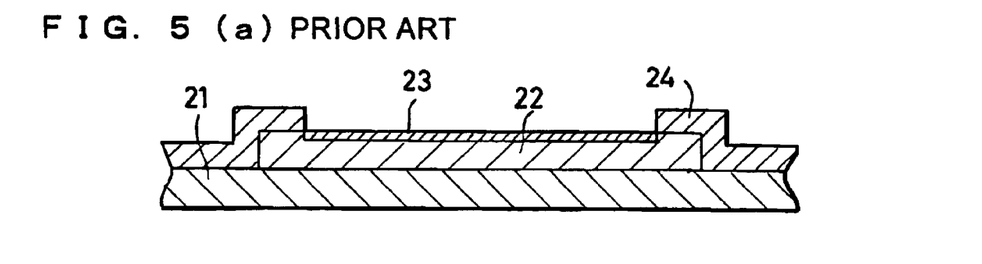
FIG. 5(a) is a process sectional view that describes a method to manufacture a semiconductor device by forming the protrusive electrode on a conventional electrode pad by electroless plating, and a sectional drawing that shows a step to remove an oxide film formed on the semiconductor substrate from the surface of the electrode pad.

FIG. 5(a); On a surface of an electrode pad 22 made of Al or mainly made of Al which is formed on a semiconductor substrate 21, there is an area that is not covered with a protective coat 24. The figure is a section view which shows a step to remove an oxide film 23 that is formed on the uncovered area described above. In this step, the oxide film 23 is completely removed using sodium hydroxide, phosphoric acid, etc. By the way, a formation of an insulating film on the surface of the semiconductor substrate 21 is omitted from the figure.

Figure 5B:
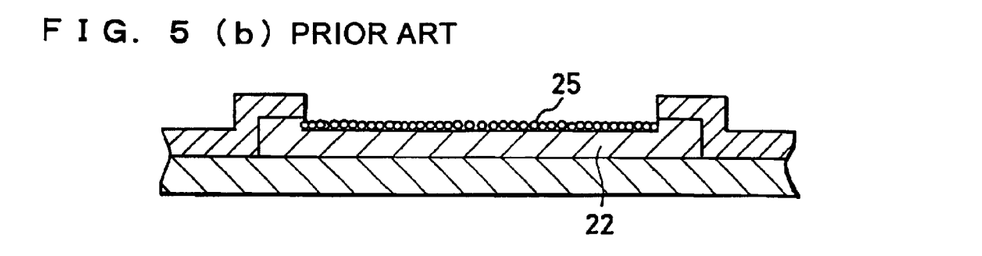
FIG. 5(b) is a process sectional view that describes a method to manufacture a semiconductor device by forming the protrusive electrode on a conventional electrode pad by electroless plating, and a sectional drawing that shows a step to form a Zn Film on the electrode pad.

The oxide film 23 will be formed on the electrode pad 22 again, if the electrode pad 22 from which the oxide film 23 is removed is left as it is. Thus, as the FIG. 5(b) shows, a Zn film 25 is formed on the electrode pad 22 to prevent the re-formation of the oxide film 23. A process to form the Zn film 25 uniformly on the surface of the electrode pad 22 (zincate process) is a preliminary step to form a protrusive electrode 26 (see FIG. 5(c)) by the electroless plating that precipitates Ni or a Ni alloy (will be referred to as Ni). The zincate process is carried out as follows; the electrode pad 22 is dipped into an alkaline solution that contains Zn, and displacement reaction is occurred between Al in the electrode pad 22 and Zn ions in the solution.

Figure 5C:
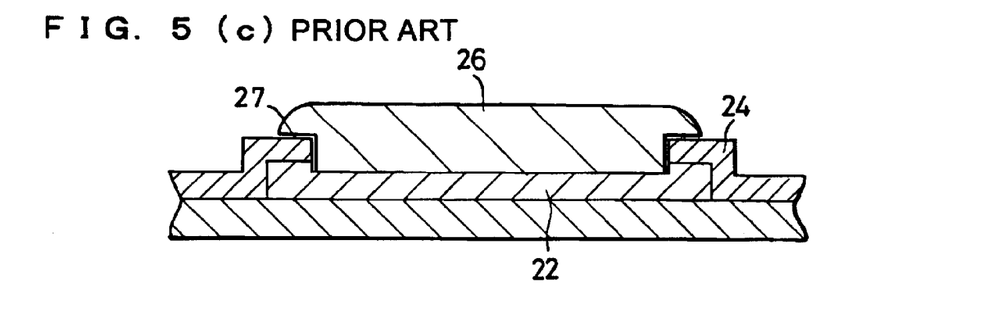
FIG. 5(c) is a process sectional view that describes a method to manufacture a semiconductor device by forming the protrusive electrode on a conventional electrode pad by electroless plating, and a sectional view that shows a step to form the protrusive electrode made of Ni or a Ni alloys by electroless plating.

FIG. 5(c) is a sectional view that shows a step to form the protrusive electrode 26 through the electroless plating that precipitates Ni. The plating by Ni through the use of the electroless plating is done as the electrode pad 22 on which the Zn film 25 is evenly formed is dipped into electroless Ni plating liquid. On account of this, Zn in the Zn film 25 dissolves in the electroless Ni plating liquid and the displacement reaction between Zn and Ni ions in the electroless Ni plating liquid occurs, then Ni is precipitated on the electrode pad 22. Once Ni that becomes a nucleus is precipitated on the electrode pad 22, due to an autocatalytic reaction (self-reduction reaction) of the electroless Ni plating liquid, Ni is self-precipitated on Ni, and the protrusive electrode 26 is formed.

Since the Zn film 25 is evenly formed in the zincate process as above, Ni uniformly grow on the electrode pad 22 and the protrusive electrode 26 which is well-shaped and small grain size is obtained. However, since the protective coat 24 and the protrusive electrode 26 are not chemically joined, a microscopic gap 27 is formed between these two.

Figure 5D:
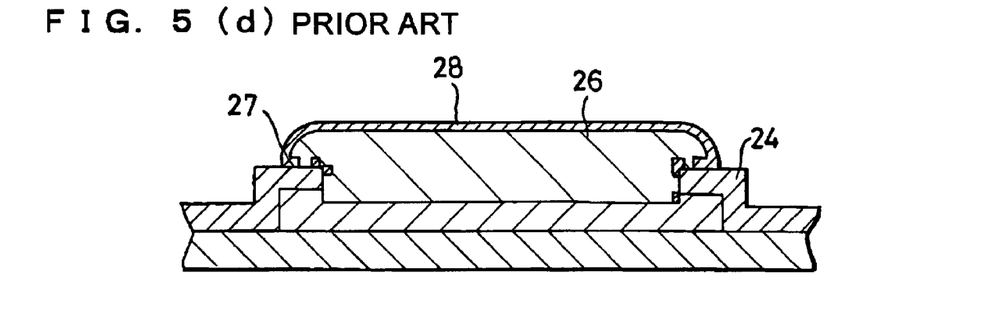
FIG. 5(d) is a process sectional view that describes a method to manufacture a semiconductor device by forming the protrusive electrode on a conventional electrode pad by electroless plating, and a sectional view that shows a step to form an Au film on the protrusive electrode by electroless plating.

FIG. 5(d) is a sectional view that shows a step to form an immersion Au film 28 on the protrusive electrode 26 by immersion Au plating. The immersion Au plating is done by dipping the electrode pad 22, on which the protrusive electrode 26 is formed, into an immersion Au plating liquid. In this manner, as the figure shows, the immersion Au film 28 is formed on the surface of the protrusive electrode 26. By the way, to prevent corrosion of the electrode pad 22 in a subsequent step of electroless Au plating, the surface of the protrusive electrode 26 must be covered by the immersion Au film 28, by this immersion Au plating.

However, due to extreme narrowness of the gap 27 between the protective coat 24 and the protrusive electrode 26, it is difficult to remove the electroless Ni plating liquid from the gap 27. If the immersion Au plating is done on condition that the electroless Ni plating liquid still remains in the gap 27, the immersion Au plating liquid cannot enter the gap 27 adequately. Thus the immersion Au film 28 that formed in the area where the protective coat 24 faces the surface of the protrusive electrode 26 becomes defective, and leaves areas not plated by the immersion Au film 28 on the surface of the protrusive electrode 26.

In a conventional method of this process, areas not plated by the immersion Au film 28 remain on the surface of the protrusive electrode 26, because the microscopic gap 27 between the protective coat 24 and the protrusive electrode 26 is formed. Therefore, in a subsequent step:
 an adhesion between the electrode pad 22 and the protrusive electrode 26 becomes poor, because the electroless Au plating liquid enters the gap 27 and the electrode pad 22 is corroded; and
 reliability of the semiconductor device becomes significantly lower, owing to a seepage of the electroless Au plating liquid from the protrusive electrode 26.

So, an object of the present invention is to offer a highly reliable semiconductor device with good adhesion between an electrode pad and a protrusive electrode and the manufacturing method of the device, by completely covering the surface of the protrusive electrode with a defect-free film that is formed on the surface of the protrusive electrode.

By the way, as a method to form an electrode for a semiconductor element, to resolve a problem that a microscopic gap between a protective coat and a metal film (a protrusive electrode) which is formed due to warpage of a wafer, Japanese Laid-Open Patent Application No. 10-125682/1998 (Tokukaihei 10-125682; published on May 15, 1998) discloses:

① a technique to reduce warpage of the wafer due to the difference of temperature, caused as a plating step and a washing step are done at the same temperature;

② a technique to reduce warpage of the wafer by attaching a reinforcing frame; and ③ a technique to carry out Ni plating again at room temperature.

However, what the invention disclosed in the application above intends is to reduce the gap between the protective coat and the metal film due to warpage of the wafer. So its object is different from that of the present invention trying to resolve a problem caused by a gap between a protective coat and a protrusive electrode, which is formed because these two are not chemically joined.

Moreover, the technique disclosed in the application above cannot avoid formation of a microscopic gap between the protective coat and the metal film (protrusive electrode), because these two are not chemically joined. Thus the technique disclosed in the application above cannot resolve the problem that the present invention aims to resolve.

SUMMARY OF THE INVENTION

An object of the present invention is to provide a highly reliable semiconductor device with good adhesion between an electrode pad and a protrusive electrode and manufacturing method thereof, by covering a surface of the protrusive electrode completely with a defect-free film.

In order to fulfil the above, the method of manufacturing the semiconductor device in accordance with the present invention is a method of manufacturing of a semiconductor device containing a protrusive electrode formed on a part of a surface of an electrode pad on a semiconductor substrate, and a protective coat covering a remaining part of the surface, and including the steps of:

(a) forming the protrusive electrode on the electrode pad;

(b) etching to form a gap between the protrusive electrode and the protective coat after the step (a); and (c) plating to form a metal film on the surface of the protrusive electrode after the step (b).

In a conventional method of manufacturing a semiconductor device, an Au film is formed as follows:

after removing an oxide film from a surface of a electrode pad made of Al or mainly made of Al, a Zn film is formed by conducting a zincate process (displacement between Al and Zn on the surface) several times;

a protrusive electrode is formed by electroless plating that causes displacement reaction between the Zn film and Ni or a Ni alloy; and immediately afterward the Au film is formed on the surface by conducting immersion Au plating.

However, since the protective coat and the protrusive electrode on the surface of the electrode pad are not chemically joined, a microscopic gap exists between these two. So, in the step of the immersion Au plating, the immersion Au liquid does not enter the gap adequately, because the gap is extremely narrow. Therefore, it is difficult to cover an area between the surface of the protrusive electrode and the protective coat with the Au film.

Since the surface of the protrusive electrode is not completely covered with the Au film, the electrode pad is corroded in a subsequent step conducting electroless Au plating to the protrusive electrode, and the adhesion between the electrode pad and the protrusive electrode becomes poor. Also, the reliability of the semiconductor device becomes significantly lower, because electroless plating liquid, which is used to form the protrusive electrode in the step of the electroless Au plating, seeps from the electrode.

So, the method of manufacturing of the semiconductor device in accordance with the present invention includes the steps of:

forming the protrusive electrode;

etching to form the gap between the protrusive electrode and the protective coat after the step of forming the electrode; and plating to form a film on the surface of the protrusive electrode through the plating step as above.

That is to say, the film completely covering the surface of the protrusive electrode, i.e. the defect-free film is formed by conducting the plating step, after the microscopic gap between the protective coat and the protrusive electrode is widened in the etching step to be the one which the plating liquid can enter uniformly. Further, the etching may be done at any temperature. So it may be done at room temperature, for example.

Also, by widening the microscopic gap between the protective coat and the protrusive electrode to be the one which the plating liquid can enter uniformly, the etchant used in the etching step and the plating liquid used in the plating step can be washed out easily. In other words, the cleaning of the etchant and the plating liquid can be done more efficiently.

By the way, although a form and a width of the gap is not fixed as long as the plating liquid can enter the gap uniformly, it is preferable that a distance between the protective coat and the protrusive electrode is kept between 0.05 $\mu$m and 1 $\mu$m, to form an adequate gap. By keeping the distance as above, the plating liquid can enter the gap easily.

In the arrangement above, in the plating step, the defect-free film covering all over the surface of the protrusive electrode is formed, due to the proper formation of the film in the area between the protrusive electrode and the protective coat. Thus, for instance, when electroless Au plating is conducted to the protrusive electrode, corrosion of the protrusive electrode by electroless Au plating liquid in the area where the protrusive electrode and the electrode pad contact can be prevented, because the film covering all over the surface of the protrusive electrode prevents the entry of the electroless Au plating liquid.

Also, as the film covers every part of the surface, for instance, even if the protrusive electrode is formed by way of electroless plating, electroless plating liquid does not seep from the protrusive electrode. Therefore, it is proved that the reliability of the semiconductor device is increased, since leakage-related failures caused by the seepage of the electroless plating liquid are eradicated.

For a fuller understanding of the nature and advantages of the invention, reference should be made to the ensuing detailed description taken in conjunction with the accompanying drawings.

BRIEF DESCRIPTION OF THE DRAWINGS

FIG. 1(*a*) is a process sectional view showing a method to manufacture a semiconductor device in accordance with Embodiment 1 of the present invention, and a sectional view describing a step of wet etching of an electrode pad formed on a semiconductor substrate.

FIG. 1(b) is a process sectional view showing a method to manufacture a semiconductor device in accordance with Embodiment 1 of the present invention, and a sectional view describing a step to form a Zn film on the electrode pad.

FIG. 1(c) is a process sectional view showing a method to manufacture a semiconductor device in accordance with Embodiment 1 of the present invention, and a sectional view describing a step to form a protrusive electrode on the electrode pad by Ni plating or Ni alloy plating.

FIG. 1(d) is a process sectional view showing a method to manufacture a semiconductor device in accordance with Embodiment 1 of the present invention, and a sectional view describing a step to form a gap between a protective coat and the protrusive electrode by etching.

FIG. 1(e) is a process sectional view showing a method to manufacture a semiconductor device in accordance with Embodiment 1 of the present invention, and a sectional view describing a step to conduct immersion Au plating on the surface of the protrusive electrode.

FIG. 1(f) is a process sectional view showing a method to manufacture a semiconductor device in accordance with Embodiment 1 of the present invention, and a sectional view describing a step to conduct electroless Au plating to the protrusive electrode where an immersion Au film is formed.

DESCRIPTION OF THE EMBODIMENTS

The following description will describe embodiments of the present invention with the aid of FIGS. 1(a) through 1(f) and FIGS. 2 through 4.

(Embodiment 1)

FIGS. 1(a) through 1(f) are process sectional views showing a method to form a protrusive electrode in accordance with Embodiment 1 of the present invention. With reference to FIGS. 1(a) through 1(f), a semiconductor device and its manufacturing method related to the Embodiment 1 will be described here.

Figure 1:
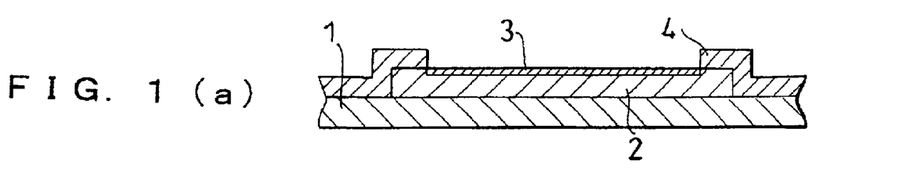

As FIG. 1(a) shows, an electrode pad 2 and a protective coat 4 are formed on a semiconductor substrate 1, and an opening to form the protrusive electrode is provided on the electrode pad 2. An oxide film 3 is formed on the surface of the electrode pad 2 (the surface is naturally oxidized), because the opening on the electrode pad 2 is not covered by the protective coat 4. By the way, owing to the use of a fluorine-containing gas to etch the protective coat 4 and form the opening on the electrode pad 2, sometimes a fluoride is formed on the electrode pad 2. Also, there are provided an active element and wiring (neither of them are illustrated) on the semiconductor substrate 1, and the active element and the wiring are covered with the protective coat 4.

To remove the oxide film 3 and the fluoride on the electrode pad 2, the electrode pad 2 is etched by using sodium hydroxide, phosphoric acid, etc. So that the electrode pad 2 has a resultant thickness no less than 0.5 $\mu$m (5000 Å).

As FIG. 1(b) shows, on the electrode pad 2, due to displacement reaction between Al and Zn, a Zn film 5 is evenly formed on the electrode pad 2. If the electrode pad 2 from which the oxide film 3 is removed is left as it is, the oxide film 3 will be formed again. However, the re-formation of the oxide film 3 can be prevented by forming the Zn Film 5 evenly on the electrode pad 2.

The Zn film 5 is formed in a following manner;
(1) Dip the electrode pad 2 into an alkaline solution containing Zn. Then the Zn film 5 on the electrode pad 2 is formed by displacement reaction between Al of the electrode pad 2 and Zn ions in the solution.
(2) Wash the electrode pad 2 with pure water.
(3) Dip the electrode pad 2 into nitric acid (the series of steps from (1) to (3) are conducted one or two times).
(4) And finally dip the electrode pad 2 into an alkaline solution containing Zn. The whole steps to form the Zn film 5 will be referred to as a zincate process.

By the way, in the zincate process, the electrode pad 2 is etched approximately 4 $\mu$m, on condition that the electrode pad 2 is dipped into an alkaline solution containing Zn for 30 seconds, washed with pure water for 5 minutes, dipped into nitric acid for 30 seconds, and the process dipping into the alkaline solution is conducted twice.

FIG. 1(c) shows a Ni or a Ni alloy (will be referred to as Ni) protrusive electrode 6 formed on the electrode pad 2 by Ni or Ni alloy plating.

Electroless plating by Ni is conducted by dipping the electrode pad 2, on which the Zn film 5 is evenly formed, into an electroless Ni plating liquid. On account of this, Zn in the Zn film 5 dissolves in the electroless Ni plating liquid, Ni is precipitated due to displacement reaction between Zn and Ni ions in the electroless Ni plating liquid (i.e., after Ni that becomes a nucleus is precipitated). Then self-precipitation of Ni above Ni is caused by autocatalytic reaction (self-reduction reaction) of the electroless Ni plating liquid, and the protrusive electrode 6 is thus formed.

Owing to the formation of the uniform Zn film 5 in the zincate process described above, Ni or an alloy of Ni develop uniformly, and the protrusive electrode 6 with small grain size, no gap and smooth surface can be obtained. An acid solution containing either Ni or a reducing agent of Ni is used as the electroless Ni plating liquid.

The electroless plating by Ni as above is conducted in a state that a temperature of an acid solution containing either Ni or a reducing agent of Ni is kept at approximately 90° C. However, the processing time is not fixed and specified with reference to purposes of semiconductor devices. A microscopic gap 7 is formed between the protrusive electrode 6 and the protective coat 4, since the protrusive electrode 6 developed on the surface of the electrode pad 2 and the protective coat 4 are not chemically joined.

Setting the height of the protrusive electrode 6 at 5 µm provides suitable space between the semiconductor substrate 1 and another member, to mount the semiconductor device to another member. The space thus secured is sufficient to connect the semiconductor device with the protrusive electrode thereon to, for instance, another semiconductor device, a substrate, or conductive leads projecting over a device hole (not illustrated).

However, considering the fact that the surface of the protrusive electrode 6 is also etched and loses its height in the subsequent etching step to widen the gap 7, the protrusive electrode 6 is formed 1 µm to 2 µm higher than the required height.

FIG. 1(d) shows a gap 17 formed by widening the microscopic gap 7 between the protective coat 4 and the protrusive electrode 6 by etching, after the protrusive electrode 6 is formed. An acid solution is used as an etchant for the etching step described above, and especially nitric acid is preferable. The use of a nitric acid solution for the etchant enables etching at room temperature, and also the electrode pad 2 is not destroyed by the etchant in the case of over-etching, since nitric acid does not corrode Al.

However, if the etchant enters the junction of the electrode pad 2 and the protrusive electrode 6, an area of the junction of these two is reduced and adhesion strength of these two decreases. Thus a duration of the etching must be controlled strictly. In the present embodiment, a 2% nitric acid solution is used for the etchant and the duration of etching is set to 2 minutes.

Provided that the gap 17 which is more than 0.05 µm is formed between the surface of the protective coat 4 and the surface of the protrusive electrode 6, immersion Au plating liquid adequately enters the gap 17 in a subsequent immersion Au plating step, and a defect-free immersion Au film 8 (film, Au film) can be formed in an area where the surface of the protrusive electrode 6 faces with the protective coat 4.

FIG. 1(e) shows the immersion Au film 8 formed on the surface of the protrusive electrode 6 by immersion Au plating, after the gap 17 shown in FIG. 1(d) is formed by etching. Since the immersion Au film 8 is precipitated by displacement of Ni, the thickness of the film is approximately 0.05 µm. Doing the immersion Au plating prevents oxidation of the protrusive electrode 6 made of Ni or a Ni alloy. Also, the immersion Au plating is a preliminary treatment step, if electroless Au plating is needed to be done to the protrusive electrode 6.

FIG. 1(f) is a sectional drawing showing an electroless Au film 9 (film, Au film) formed by conducting the electroless Au plating to the protrusive electrode 6 with the immersion Au film 8 formed on its surface. In the case of the electroless Au plating, by dipping the protrusive electrode 6 with the immersion Au film 8 formed on its surface into an electroless Au plating liquid, the electroless Au film 9 grows on the immersion Au film 8 because of a reducing agent in the electroless Au plating liquid. In other words, The electroless Au film 9 is formed over the immersion Au film 8 which is formed on the surface of the protrusive electrode 6.

The surface of the protrusive electrode 6 of the semiconductor device of the present invention is completely covered by the immersion Au film 8, and the electrode pad 2 is not etched by the electroless Au plating liquid, even if the electroless Au plating is conducted for a long time. Therefore, it is possible to form the electroless Au film 9 which is more than 1 µm thick.

Provided that only the immersion Au film 8 is formed on the surface of the protrusive electrode 6, it is difficult to join the protrusive electrode 6 with Sn on the surface of the conductive lead (described above, not illustrated) by Au—Sn joint. On the other hand, by forming the electroless Au film 9 which is more than 1 µm thick on the surface of the protrusive electrode 6, it becomes easy to join the protrusive electrode 6 with Sn on the surface of the conductive lead. Since in this case Au and Sn are joined as an Au—Sn alloy through the Au—Sn joint, they are joined stronger than Au—Au joint by thermocompression bonding. In other words, by forming the electroless Au film 9 which is more than 1 µm thick on the surface of the protrusive electrode 6, it becomes easier to join the protrusive electrode 6 with the conductive lead firmly.

By the way, provided that only the immersion Au film 8 is formed on the surface of the protrusive electrode 6, a protrusive electrode 6 may be joined with another protrusive electrode 6, or with a substrate by anisotropic film etc.

(Embodiment 2)

Figure 2:
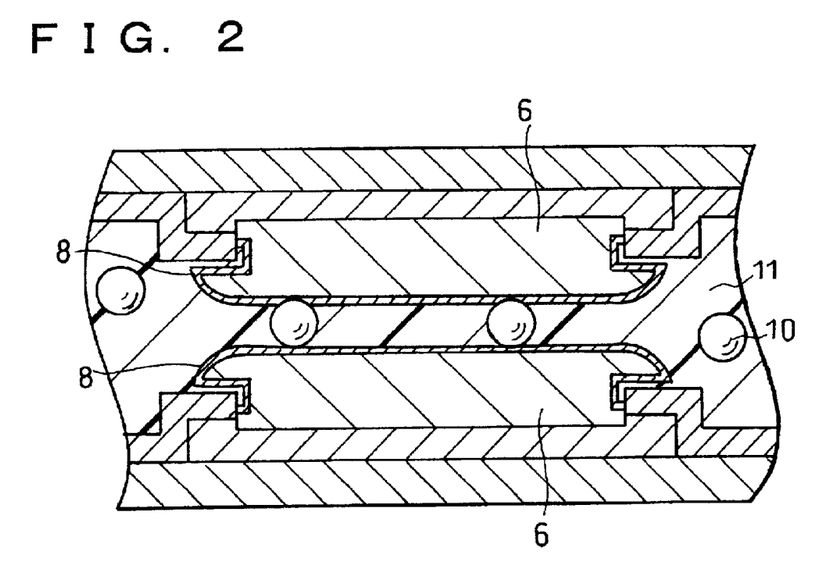
FIG. 2 is a sectional view illustrating two semiconductor devices of the present invention mounted to each other.

FIG. 2 is a sectional view illustrating two semiconductor devices of the present invention mounted each other. In this embodiment, what is described is the case that one semiconductor device of the present invention is joined with another semiconductor device of the present invention by an anisotropic film.

First, the anisotropic film is tentatively compressed on either one of the two semiconductor devices. Then after bringing the device into alignment with the other, the two semiconductor devices are joined by thermocompression bonding. In this embodiment, the step is done at a temperature of around 200° C. and with approximately 1000 kg/cm² of pressure.

A conductive particle 10 for connecting two protrusive electrodes 6 of the semiconductor devices is situated between the pair of protrusive electrodes 6, and the pair of the protrusive electrodes 6 are electrically connected with each other via the conductive particle 10. By the way, because of the thermocompression bonding, the anisotropic film is melted to become a binder resin 11 and bridges the two semiconductor devices.

Both of the semiconductor devices having the structure described in FIGS. 1(e) and 1(f) can be connected by the method described as above. However, using the semiconductor device with the structure described in FIG. 1(e) costs lower.

(Embodiment 3)

Figure 3:
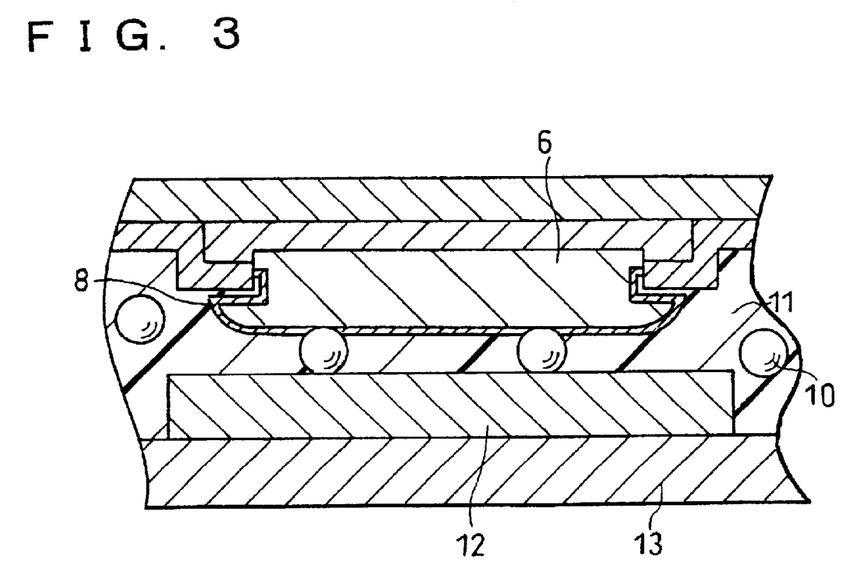
FIG. 3 is a sectional view illustrating the semiconductor device of the present invention mounted on a substrate.

FIG. 3 shows how the semiconductor device of the present invention is connected and mounted, using an anisotropic film (not illustrated), to a substrate 13 on which a conductive pattern 12 is wired. Examples of the substrate 13 include an insulating film without a device hole (Chip On Film), a conventional printed board, a glass substrate, and a ceramic substrate.

Firstly, the anisotropic film is tentatively compressed on the conductive pattern 12 on the substrate 13. Then after bringing it into alignment with the semiconductor device having the protrusive electrode 6, the semiconductor device and the substrate 13 are joined by thermocompression bonding. In this embodiment, the thermocompression bonding is done at a temperature of around 200° C. and with approximately 1000 kg/cm² of pressure.

A conductive particle 10 is situated between the protrusive electrode 6 of the semiconductor device as above and the conductive pattern 12, for connecting these two. The protrusive electrode 6 and the conductive pattern 12 are electrically connected with each other via the conductive particle 10. By the way, the anisotropic film is melted to become a binder resin 11 in the thermocompression bonding step, and bridges the semiconductor device and the substrate 13.

(Embodiment 4)

Figure 4:
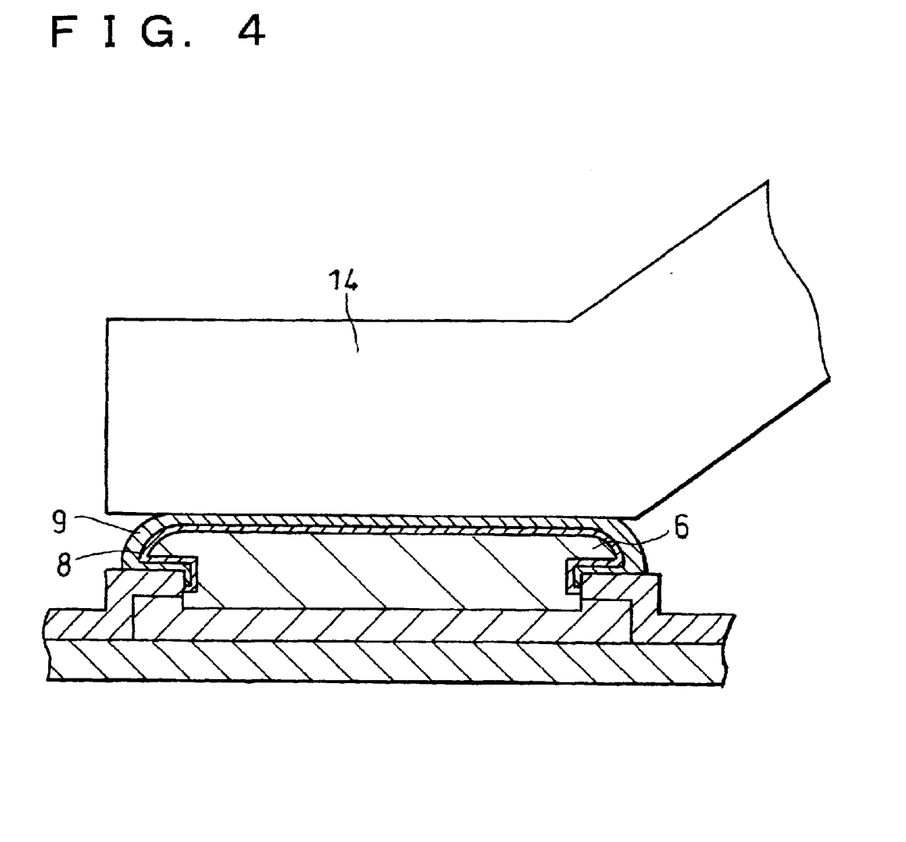
FIG. 4 is a sectional view showing a state that the semiconductor device of the present invention is connected to a conductive lead.

FIG. 4 is a sectional drawing showing the semiconductor device of the present invention connected with a conductive lead 14 jutting from a device hole (not illustrated) of an insulating film, TCP (Tape Carrier Package).

The conductive lead 14 is electrically connected with a conductive pattern (not illustrated) formed on TCP, and Sn plating is done on the surface of the conductive lead 14. As FIG. 4 shows, the electroless Au film 9 which is thicker than 1 $\mu$m is formed over the immersion Au film 8 formed on the surface of the protrusive electrode 6.

Then after bringing the protrusive electrode 6 of the semiconductor device into alignment with the conductive lead 14, these two are electrically connected by thermocompression bonding. This thermocompression bonding is done at a temperature of around 500° C. and with approximately 1200 kg/cm$^2$ of pressure. Also, the thickness of Sn plating on the conductive lead 14 is adjusted so that the Au of the electroless Au film 9 weighs 4 times as much as the Sn plating on the conductive lead 14, thus adjusting the ratio, the mechanical strength of the joint between the protrusive electrode 6 and the conductive lead 14 is improved. So the condition of the joint becomes stable, and an electric connection between the protrusive electrode 6 and the conductive lead 14 becomes more proper.

In a case of manufacturing method of a semiconductor device of the present invention, it is preferable that a protrusive electrode is formed 1 $\mu$m to 2 $\mu$m higher than a required height in a step of forming the protrusive electrode.

By doing so, even if the height of the protrusive electrode is decreased because the surface of the protrusive electrode is etched during an etching step to form a gap between the protrusive electrode and a protective coat, a space can be secured between a semiconductor substrate and other members, which is needed when the semiconductor device is mounted.

Also, in the etching step, the method of manufacturing the semiconductor device in accordance with the present invention may include a step to form the gap between the protrusive electrode and the protective coat using an acid solution.

On account of this, the etching step to widen the gap between the protrusive electrode and the protective coat is done with ease.

Also, the method of manufacturing the semiconductor device in accordance with the present invention may be such that an electrode pad is made of Al or mainly made of Al, and in the etching step, the gap between the protrusive electrode and the protective coat is formed by the use of nitric acid or dilute nitric acid.

By adopting this arrangement, the electrode pad is not corroded by the etchant, since the nitric acid and the dilute nitric acid do not corrode Al that forms the pad. So a destruction of the pad can be prevented in the case of over-etching during the etching step. Also, the etching can be done at room temperature, by using a solution of nitric acid as the etchant.

Also, it is preferable that the nitric acid used in the etching step is a 2% aqueous solution of nitric acid.

On account of this, the etching step can be done easily. By the way, provided that the 2% aqueous solution of nitric acid is used, the duration of etching is preferably about 2 minutes. In this manner, by controlling the etching duration strictly, degradation of the adhesion strength between the electrode pad and the protrusive electrode, caused as the etchant enters the junction between these two, can be prevented.

Furthermore, it is preferred that the gap between the protrusive electrode and the protective coat is not narrower than 0.05 $\mu$m.

Because of this, in a step of immersion Au plating, an immersion Au plating liquid enters the gap adequately, and a defect-free immersion Au film (film, Au film) can be formed in the area between the surface of the protrusive electrode and the protective coat.

Further, In the method of manufacturing the semiconductor device in accordance with the present invention, the film described above may be an Au film.

By adopting this arrangement, the electrical connectivity of the protrusive electrode is improved. In other words, a semiconductor device with better electrical connectivity can be produced.

Also, in the plating step, the method of manufacturing the semiconductor device in accordance with the present invention may include the steps of:

an immersion Au plating to form an immersion Au film on the protrusive electrode; and electroless Au plating to form an electroless Au film on the immersion Au film, after the immersion Au plating.

On account of this, in the step of the immersion Au plating, an immersion Au plating liquid easily enters the gap between the protrusive electrode and the protective coat. Therefore, the defect-free Au film is formed on every part of the protrusive electrode. So, since electroless Au plating liquid and the electrode pad do not contact each other in the step of the electroless Au plating, a reaction between these two does not occur. That is to say, the electroless Au plating can be done for long duration, since the electrode pad is not etched by the electroless Au plating liquid.

Also, in the step of the electroless Au plating, it is preferable that the electroless Au film is not thinner than 1 $\mu$m.

On account of this, the electrical connectivity of the protrusive electrode is improved even more. Namely, it becomes possible to join the protrusive electrode with Sn on the surface of a conductive lead terminal of TCP (Tape Carrier Package) which is an insulating film with a device hole, by Au—Sn thermocompression bonding.

A semiconductor device in accordance with the present invention includes:

a protrusive electrode formed on a part of a surface of an electrode pad on a semiconductor substrate;

a protective coat covering a remaining part of the surface; and a film covering a surface of the protrusive electrode being formed in an area between the protrusive electrode and the protective coat.

In a conventional semiconductor device, no film is formed in an area between the surface of the protrusive electrode and the protective coat. Therefore, an electrode pad is corroded in a subsequent step of electroless Au plating, and provided that the protrusive electrode is formed through electroless plating, reliability of the semiconductor device becomes lower, owing to seepage of electroless plating liquid from the protrusive electrode.

However, being different from the conventional semiconductor device, the semiconductor device of the present invention has a film covering every part of the surface of the protrusive electrode, including the area facing the protective coat. Thus, for instance, in the case of conducting electroless Au plating to the protrusive electrode, since the film formed all over the surface blocks electroless Au plating liquid, a corrosion of the electrode pad by the liquid can be prevented in the area of junction between the protrusive electrode and the electrode pad.

Further, the semiconductor device of the present invention may adopt an Au film for the film described above.

On account of this, the electrical connectivity of the protrusive electrode is improved. Thus a semiconductor device with better electrical connectivity can be provided.

Moreover, the semiconductor device of the present invention may include the protrusive electrode being electrically connected to any one of a protrusive electrode of another semiconductor device, an insulating film (Chip On Firm), and a substrate by using an anisotropic film.

By way of this, the electrical connectivity of the protrusive electrode is improved.

Also, in the semiconductor device of the present invention, Au on the surface of the protrusive electrode may be electrically connected with Sn plating on a surface of a conductive lead.

By adopting this arrangement, it becomes possible to join the protrusive electrode with Sn on the surface of a conductive lead, by Au—Sn thermocompression bonding and consequently electrical connectivity of the protrusive electrode is improved even more. By the way, a weight ratio between Au on the surface of the protrusive electrode and Sn plating on the conductive lead is preferred to be Au:Sn=8:2. On account of this, a mechanical strength of the joint between the protrusive electrode and the conductive lead is improved and the connection between these two is stabilized. Also, an electric connectivity between the protrusive electrode and the conductive lead becomes more proper.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A semiconductor device comprising a protrusive electrode on a part of a surface of an electrode pad on a semiconductor substrate;
   a protective coat which covers remaining exposed portions of the surface of the electrode pad;
   a gap more than 0.05 μm wide between the protective coat and the protrusive electrode; and
   a layer covering the entire protrusive electrode, including the gap between the protrusive electrode and the protective coat, for preventing oxidation of exposed surfaces of the protrusive electrode;
   wherein the layer, covering the entire protrusive electrode and within the gap, comprises an immersion plated film and an electroless plated film.

2. The semiconductor device of claim 1, wherein the film is Au film.

3. The semiconductor device of claim 1, wherein the protrusive electrode is electrically connected to any of a protrusive electrode of another semiconductor device, an insulating film, and a substrate by an anisotropic film.

4. The semiconductor device of claim 2, wherein Au on the surface of the protrusive electrode and Sn plating on a surface of a conductive lead are electrically connected.

5. The semiconductor device of claim 1, wherein the protrusive electrode is made of Ni, a Ni alloy, or mainly made of Ni.

6. The semiconductor device of claim 2, wherein the Au film is at least 1.0 μm thick.

7. The semiconductor device of claim 1, wherein the layer, which is formed in an area of a surface of the protrusive electrode facing the protective coat and provided for preventing oxidation of the surface of the protrusive electrode, does not touch the electrode pad.

8. A semiconductor device comprising a protrusive electrode on a part of a surface of an electrode pad on a semiconductor substrate;
   a protective coat which covers remaining exposed portions of the surface of the electrode pad;
   a gap between the protective coat and the protrusive electrode; and
   a layer covering the entire protrusive electrode, including the gap between the protrusive electrode and the protective coat, for preventing oxidation of exposed surfaces of the protrusive electrode;
   wherein the layer, covering the entire protrusive electrode and within the gap, comprises an immersion plated film and an electroless plated film.

9. The semiconductor device of claim 8, wherein the film is Au film.

10. The semiconductor device of claim 9, wherein the protrusive electrode is electrically connected to any of a protrusive electrode of another semiconductor device, an insulating film, and a substrate by an anisotropic film.

11. The semiconductor device of claim 9, wherein Au on the surface of the protrusive electrode and Sn plating on a surface of a conductive lead are electrically connected.

12. The semiconductor device of claim 8, wherein the protrusive electrode is made of Ni, a Ni alloy, or mainly made of Ni.

13. The semiconductor device of claim 9, wherein the Au film is at least 1.0 μm thick.

14. The semiconductor device of claim 8, wherein the layer, which is formed in an area of a surface of the protrusive electrode facing the protective coat and provided for preventing oxidation of the surface of the protrusive electrode, does not touch the electrode pad.

* * * * *